(12) United States Patent
Ryu

(10) Patent No.: US 8,143,909 B2
(45) Date of Patent: Mar. 27, 2012

(54) UNIVERSAL TEST SOCKET AND SEMICONDUCTOR PACKAGE TESTING APPARATUS USING THE SAME

(75) Inventor: In-sun Ryu, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 12/684,581

(22) Filed: Jan. 8, 2010

(65) Prior Publication Data

US 2010/0295572 A1   Nov. 25, 2010

(30) Foreign Application Priority Data

May 22, 2009   (KR) .................. 10-2009-0045205

(51) Int. Cl.
  *G01R 31/00* (2006.01)
  *G01R 31/20* (2006.01)

(52) U.S. Cl. ......... 324/750.16; 324/754.08; 324/756.02; 324/756.04

(58) Field of Classification Search ............... 324/756.02
  See application file for complete search history.

(56) References Cited

U.S. PATENT DOCUMENTS

| | | | | |
|---|---|---|---|---|
| 5,127,837 | A * | 7/1992 | Shah et al. | 439/71 |
| 6,354,859 | B1 * | 3/2002 | Barabi et al. | 439/331 |
| 6,948,945 | B2 * | 9/2005 | Chen et al. | 439/71 |
| 7,335,030 | B2 * | 2/2008 | Kunioka et al. | 439/73 |
| 2008/0020623 | A1 * | 1/2008 | Wooden | 439/331 |

FOREIGN PATENT DOCUMENTS

| | | |
|---|---|---|
| JP | 05-218154 | 8/1993 |
| JP | 2001-083207 | 3/2001 |
| JP | 2002-090417 | 3/2002 |
| JP | 2004-158351 | 6/2004 |

* cited by examiner

*Primary Examiner* — Roberto Velez
(74) *Attorney, Agent, or Firm* — F. Chau & Associates, LLC

(57) ABSTRACT

A universal test socket includes a housing frame including a side wall, an inner protruding portion protruding inwardly from the side wall, and a through window formed at a center portion of the housing frame, wherein the through window is surrounded by the side wall, a pin plate assembly coupled to the housing frame and including a pin plate in which a plurality of test pins are arranged and a plurality of guide pins formed on periphery of the pin plate, and a package guide portion coupled to the housing frame and located above the pin plate assembly, a semiconductor package to be tested being mounted on the package guide portion. When the pin plate assembly is coupled to the housing frame, the positions of the test pins arranged in the housing frame are varied according to a rotation angle of the pin plate assembly with respect to the housing frame.

20 Claims, 14 Drawing Sheets

UNIVERSAL TEST SOCKET AND SEMICONDUCTOR PACKAGE TESTING APPARATUS USING THE SAME

CROSS-REFERENCE TO RELATED APPLICATIONS

This application claims the benefit of Korean Patent Application No. 10-2009-0045205, filed on May 22, 2009, in the Korean Intellectual Property Office, the disclosure of which is incorporated herein in its entirety by reference.

BACKGROUND

The present inventive concept relates to a test socket and an apparatus for testing a semiconductor package using the test socket, and more particularly, to a universal test socket and an apparatus for testing a semiconductor package using the universal test socket.

Semiconductor packaging technology for integrated circuits (ICs) in the semiconductor industry has been continuously developed in order to meet demands for miniaturization and mounting reliability. For example, the demand for miniaturization has accelerated development of a semiconductor package having a size close to that of a chip. Also, the demand for mounting reliability has emphasized the importance of semiconductor packaging technology which may improve efficiency of mounting work and mechanical and electrical reliability after the mounting work.

A ball grid array (BGA) package or a fine ball grid array (FBGA) package is an example of the miniaturization of a semiconductor package. In the BGA package or FBGA package, a mounting area is reduced as a solder ball is provided as an external connection terminal. Also, in some semiconductor packages, a connection pad may be used instead of the solder ball as the external connection terminal.

Even when the pitch of the external connection terminals has a constant value, the size of a semiconductor package varies as the array of the external connection terminals, for example, the number or array of the solder balls, is changed according to the type of the semiconductor package and a variety of customers' needs. Thus, when the semiconductor is tested by being installed on a test socket after the semiconductor is manufactured, a variety of test sockets are needed to accommodate different arrays of the external connection terminals of the semiconductor package and different sizes of the semiconductor package.

Accordingly, due to the variety of test sockets corresponding to the different arrays of the external connection terminals and the different sizes of the semiconductor package that are provided even though the pitch of the external connection terminals has a constant value, the manufacturing costs of the test sockets are high. Also, when a variety of test sockets are needed, since it is required to find a test socket suitable for the type of each semiconductor package and install the test socket at a testing apparatus, increased working hours may be needed, thereby lowering test efficiency. Furthermore, when a semiconductor package having a particular array of external connection terminals or a semiconductor package having a particular size is no longer manufactured, a test socket corresponding to such a semiconductor package may be disposed of and difficult to find.

SUMMARY

The inventive concept provides a universal test socket that is compatible with different arrays of external connection terminals or different sizes of semiconductor packages when the pitch of the external connection terminals of the semiconductor packages has a constant value.

The inventive concept provides an apparatus for testing a semiconductor package using the universal test socket.

According to an aspect of the inventive concept, there is provided a universal test socket including a housing frame including a side wall, an inner protruding portion protruding inwardly from the side wall, a through window formed at a center portion of the housing frame, wherein the through window is surrounded by the side wall, a pin plate assembly coupled to the housing frame and including a pin plate in which a plurality of test pins are arranged and a plurality of guide pins formed on an outer periphery of the pin plate, and a package guide portion coupled to the housing frame and located above the pin plate assembly, a semiconductor package to be tested being mounted on the package guide portion. When the pin plate assembly is coupled to the housing frame, the positions of the test pins arranged in the housing frame are varied according to the rotation angle of the pin plate assembly with respect to the housing frame.

The through window may be configured to have a rectangular shape and the pin plate may be a rectangular plate having a larger area than the through window. The rotation angle of the pin plate assembly may be one of 0°, 90°, 180° or 270°.

According to another aspect of the inventive concept, there is provided a universal test socket including a housing frame including a base plate, a through window formed in a center portion of the base plate, a side wall formed along the edge of the base plate, and an inner protruding portion inwardly protruding from the side wall, wherein the protruding portion includes a plurality of pin holes formed therein, a pin plate assembly including an upper pin plate positioned in the through window, the upper pin plate including a pin array plate including a plurality of test pins, a lower pin plate positioned below and supporting the upper pin plate, and a plurality of guide pins formed on an outer periphery of the upper and lower pin plates, and a package guide portion located above the pin plate assembly and including a package mounting area on which a semiconductor package to be tested is mounted. When the pin plate assembly is coupled to the housing frame, the positions of the test pins arranged in the housing frame are varied according to the rotation angle of the pin plate assembly with respect to the housing frame.

A hole array area for a package terminal may be formed in the package mounting area, wherein the hole array area includes a plurality of holes. The pitch of the test pins installed on the pin array plate may be the same as the pitch of holes formed in the hole array area and the pitch of external connection terminals positioned on a semiconductor package to be tested. An indication portion may be positioned on a rear surface of the inner protruding portion of the housing frame to indicate the positions of the test pins in connection with the rotation angle of the pin plate assembly when the pin plate assembly is coupled to the housing frame.

The rotation angle of the pin plate assembly may be one of 0°, 90°, 180° or 270°. When the rotation angle is one of 90°, 180° or 270°, the positions of the test pins arranged in the housing frame may be moved in at least one of an X-axis or Y-axis direction with respect to the positions of the test pins when the rotation angle is 0°.

According to another aspect of the inventive concept, there is provided an apparatus for testing a semiconductor package which includes a universal test socket including a housing frame including a side wall, an inner protruding portion protruding inwardly from the side wall and including a plurality of pin holes, a through window in a center portion of the housing frame and surrounded by the side wall, a pin plate assembly coupled to the housing frame and including a pin plate having a plurality of test pins are arranged therein, and a plurality of guide pins formed on an outer periphery of the pin plate, and a package guide portion located above the pin plate assembly, on which a semiconductor package to be tested is mounted, a cover including a pusher that electrically connects external connection terminals of the semiconductor package with upper portions of the test pins by applying pressure to the semiconductor package located on the package guide portion, and a test board located under the pin plate assembly, wherein the test board is electrically connected to lower portions of the test pins when the pusher applies the pressure the semiconductor package. When the pin plate assembly is coupled to the housing frame by inserting the guide pins in the pin holes, the positions of the test pins arranged in the housing frame are varies according to the rotation angle of the pin plate assembly with respect to the housing frame.

A hook step may be formed at the outer portion of the housing frame, a latch may be formed at the outer portion of the cover, and the cover and the housing frame may be coupled to each other by engaging the hook step with the latch.

The cover may be coupled to the housing frame in the left and right and up and down directions with respect to the housing frame. The cover may include a cover frame, and a handle may be installed at a center portion of the cover frame, and the pusher may be moved up and down according to the rotation of the handle. The pusher may be located on a lower surface of the cover frame and may include a protruding portion applying the pressure to the semiconductor package. The pitch of the test pins on the pin array plate may be the same as the pitch of external connection terminals on the semiconductor package.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
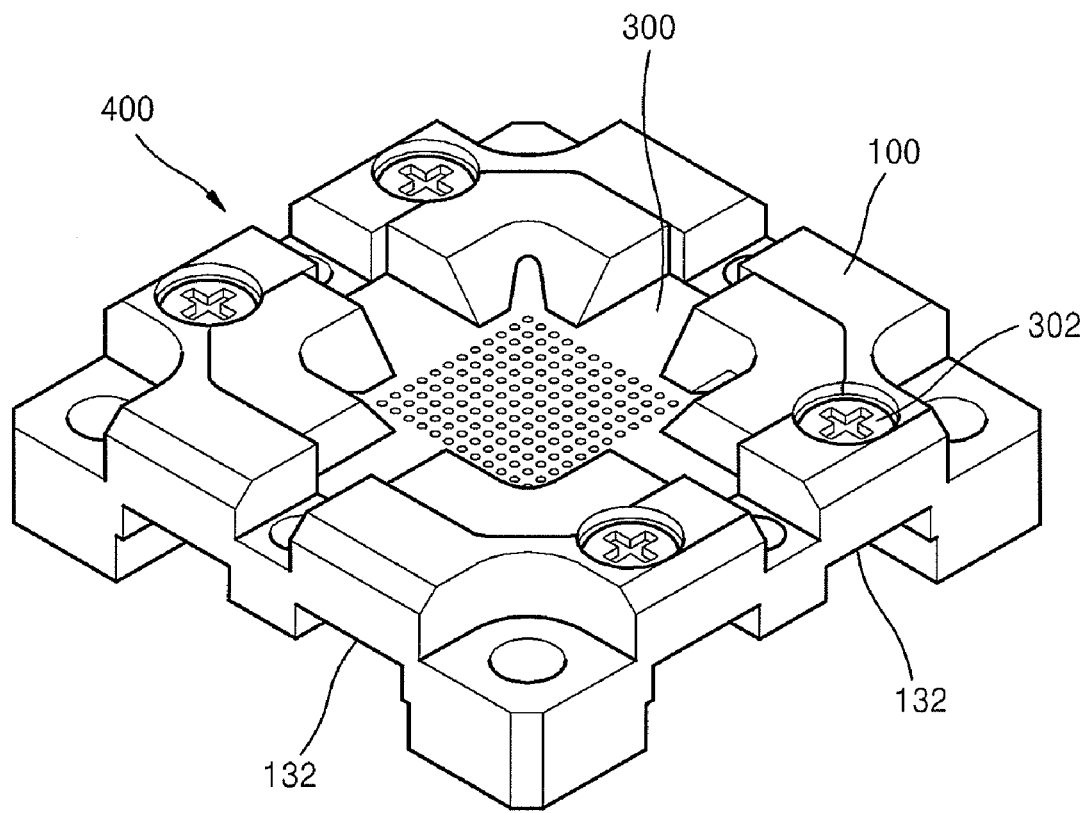
FIG. 1 is a perspective view of a universal test socket according to an exemplary embodiment of the present inventive concept.

The embodiments of the present inventive concept describe a universal test socket capable of testing a semiconductor package. The universal test socket is compatible with different arrays of external connection terminals and different sizes of semiconductor packages when the pitch of the external connection terminals is a constant value, for example, 0.5 mm. The universal test socket of the embodiments of the present inventive concept may be applied to, for example, a ball grid array (BGA) package or a fine ball grid array (FBGA) package. Also, the universal test socket of the embodiments of the present inventive concept may be applied to any package if connection pads are formed on a bottom surface of a semiconductor package.

Also, an apparatus for testing a semiconductor package according to an exemplary embodiment of the present inventive concept performs a test by pressing the semiconductor package with a cover after a universal test socket is located on a test board and the semiconductor package is mounted on the universal test socket. The semiconductor package may be pressed manually using the cover or automatically using automation equipment.

Hereinafter, the exemplary embodiments of the present inventive concept are described in detail with reference to the accompanying drawings. However, the present inventive concept is not limited thereto and it will be understood that various changes in form and details may be made therein without departing from the spirit and scope of the following claims. Exemplary embodiments are provided to explain the present inventive concept to one skilled in the art to which the present inventive concept pertains. Like reference numerals in the drawings denote like elements.

Figure 2:
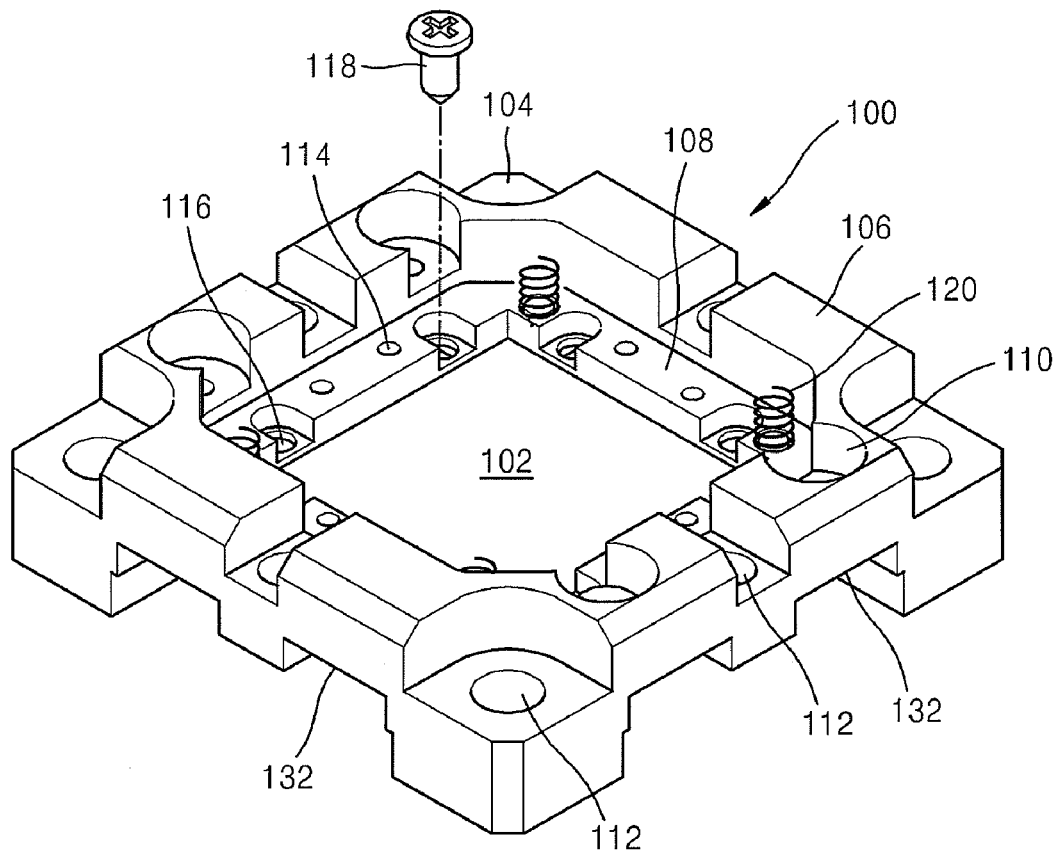
FIGS. 2-4 are perspective views of parts of the universal test socket of FIG. 1.
Figure 3:
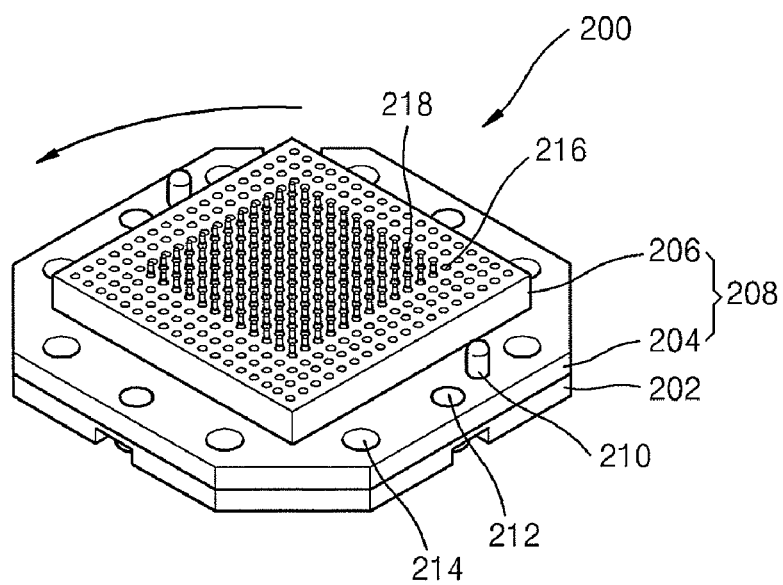
Figure 4:
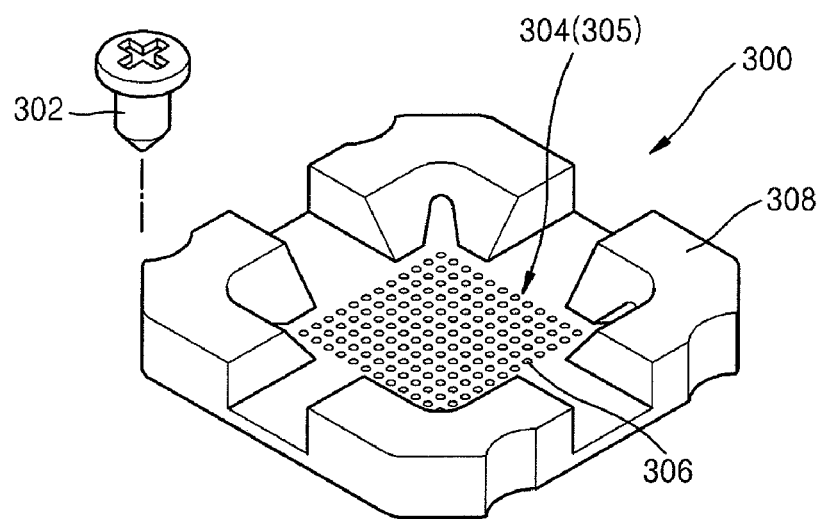

FIG. 1 is a perspective view of a universal test socket 400 according to an exemplary embodiment of the present inventive concept. FIGS. 2-4 are perspective views of parts of the universal test socket 400 of FIG. 1, in which FIG. 2 illustrates a housing frame 100, FIG. 3 illustrates a pin plate assembly 200, and FIG. 4 illustrates a package guide portion 300. Referring to FIGS. 1-4, the universal test socket 400 according to the present exemplary embodiment includes the housing frame 100, the pin plate assembly 200 and the package guide portion 300 coupled to lower and upper portions of the housing frame 100.

FIG. 2 illustrates the housing frame 100 without the package guide portion 300 and the pin plate assembly 200. The housing frame 100 includes a base plate 104 having a through window 102 formed at the center thereof and a side wall 106 formed along the edge of the base plate 104. The through window 102 has a rectangular shape. A plurality of screw holes 110 and 112 are formed in the side wall 106. The screw 302 as shown in FIG. 4 is inserted in the screw hole 110. The screw holes 112 are used to couple a test board (not shown).

The housing frame 100 includes an inner protruding portion 108 protruding toward the inside of the side wall 106. A plurality of pin holes 114 are formed in the inner protruding portion 108. A plurality of guide pins 210 are formed on the pin plate assembly 200 and inserted in the pin holes 114. A plurality of screw holes 116 are formed in the inner protruding portion 108 so that the housing frame 100 may be coupled to the pin plate assembly 200 using a screw 118.

A spring 120 is positioned at the inner protruding portion 108 of the housing frame 100. The spring 120 serves as a buffer when a semiconductor package installed on the package guide portion 300 is pressed in the vertical direction. Hook steps 132 are formed at an outer side of the housing frame 100 and used when the housing frame 100 is coupled to a cover of a semiconductor package testing apparatus, which is described further herein.

FIG. 3 illustrates the pin plate assembly 200 that is coupled to the housing frame 100. Referring to FIG. 3, the pin plate assembly 200 includes an upper pin plate 208 having a pin array plate 206. The pin array plate 206, in which a plurality of test pins 218 are installed, is inserted in the through window 102 of the housing frame 100 and coupled to the housing frame 100. The pin plate 208 includes a rectangular plate having an area greater than that of the through window 102.

The pitch of the test pins 218 installed at the pin array plate 206 is configured to be the same as the pitch of external connection terminals installed at a semiconductor package. The upper pin plate 208 includes the pin array plate 206 and a support plate 204. The pin array plate 206 and the support plate 204 may be configured separately or as one body.

A plurality of through holes 216 are formed, for example, in matrix form, in each of the pin array plate 206 and the support plate 204. The test pins 218 are arranged in a portion of the through holes 216. The pitch of the through holes 216 is configured to be the same as that of the external connection terminals of a semiconductor package. The upper pin plate 208 is supported by a lower pin plate 202 and coupled thereto. The lower pin plate 202 has a hole array area (not shown) in which a plurality of holes are formed corresponding to the through holes 216 of the pin array plate 206. The test pins 218 are configured to vertically penetrate the pin plate assembly 200.

The guide pins 210 are installed on the outer surfaces of the upper and lower pin plates 202 and 208. The guide pins 210 are inserted in the pin holes 114 from under the housing frame 100 to be coupled to the housing frame 100. A plurality of screw holes 214 are formed in the outer surfaces of the upper and lower pin plates 202 and 208. The pin plate assembly 200 is coupled to the housing frame 100 as the screw 118 passes through the screw holes 116 and 214. In FIG. 3, a screw hole 212 receives a screw to couple the upper and lower pin plates 202 and 208.

According to the present inventive concept, when the guide pins 210 are inserted in the pin holes 114 of the inner protruding portion 108 of the housing frame 100 and coupled thereto, the insertion positions of the guide pins 210 may be changed by rotating the pin-plate assembly. That is, the guide pins 210 may be inserted in different pin holes 114 by rotating the pin plate assembly 200, for example, in a counterclockwise direction, by 90°, 180°, or 270°, as indicated by the arrow in FIG. 3. As a result, the positions of the test pins 218 are changed. Thus, a variety of semiconductor packages can be universally tested even when the array of the external connection terminals of the semiconductor package or the size of the semiconductor package changes.

When coupled to the housing frame 100, the package guide portion 300 is located above the pin plate assembly 200. The package guide portion 300 is coupled to housing frame 100 using the screw 302 that is inserted into the screw hole 110 from above the housing frame 100. The package guide portion 300 includes a package mounting area 304 in which a semiconductor package to be tested is mounted. A guide wall 308 to guide the semiconductor package is located outside the package mounting area 304. The package guide portion 300 is manufactured by adjusting the size thereof to fit to the size of the semiconductor package to be tested. The package mounting area 304 corresponds to a package terminal hole array area 305 in which a plurality of through holes 306 are formed. Test pins 218 are inserted in the through holes 306.

Figure 5:
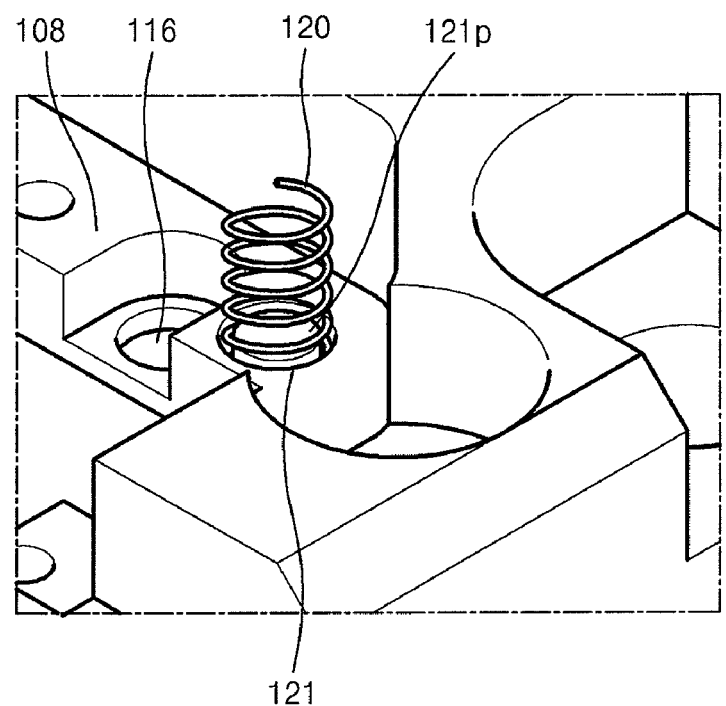
FIGS. 5-8 illustrate assembly of parts constituting the universal test socket of FIG. 1.

FIGS. 5-8 illustrate an assembly of parts constituting the universal test socket of FIG. 1. FIG. 5 is a perspective view illustrating a portion of the housing frame 100 in which the spring 120 is installed as an elastic member. Referring to FIG. 5, to minimize the possibility that the spring 120 is lost or to minimize difficulty when replacing the package guide portion 300, the spring 120 is positioned at the inner protruding portion 108 of the housing frame 100, and may be installed in a hole or recess 121 of the inner protruding portion around a protrusion 121p located in the hole 121 to hold the spring 120 in place.

Figure 6:
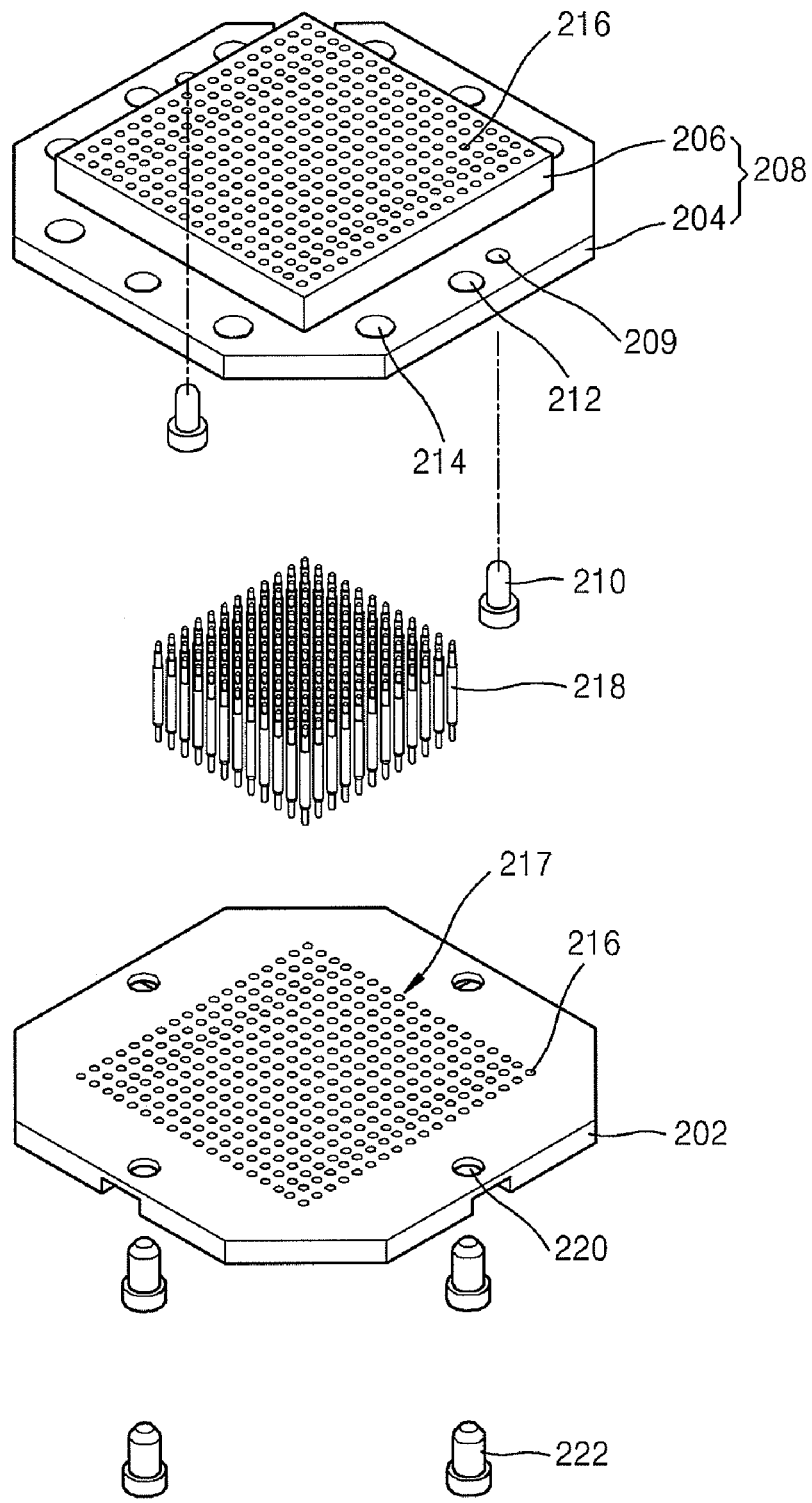

FIG. 6 is an exploded perspective view of the pin plate assembly 200. Referring to FIG. 6, the pin plate assembly 200 includes the upper pin plate 208 having the pin array plate 206 and the support plate 204, the test pins 218, and the lower pin plate 202. A plurality of insertion holes 209 and the screw holes 212 and 214 are formed in the outer surface of the support plate 204. A plurality of screw holes 220 are formed in the lower pin plate 202. The guide pins 210 are inserted in the insertion holes 209. A plurality of screws 222 are inserted in the screw holes 212 and 220 from under the lower pin plate 202 so that the upper and lower pin plates 208 and 202 may be coupled to each other. The screw holes 214 are provided to receive screws 118 for coupling the pin plate assembly 200 to the housing frame 100.

The lower pin plate 202 has a test pin hole array area 217 having the through holes 216. The pitches of the through holes 216 of the test pin hole array area 217 and the pin array plate 206 are configured to be the same as that of the external connection terminals installed at the semiconductor package. The pin array plate 206 is located above the lower pin plate 202 to correspond to the test pin hole array area 217. The through holes 216 of each of the pin array plate 206, the support plate 204, and the lower pin plate 202 are formed, for example, in matrix form to correspond to one another.

Accordingly, the test pins 218 are formed to vertically penetrate the pin plate assembly 200 through the through holes 216 formed in each of the pin array plate 206, the support plate 204, and the lower pin plate 202. During the semiconductor package test, the upper portions of the test pins 218 contact the external connection terminals of the semiconductor package and the lower portions of the test pins 218 contact the test board.

Figure 7:
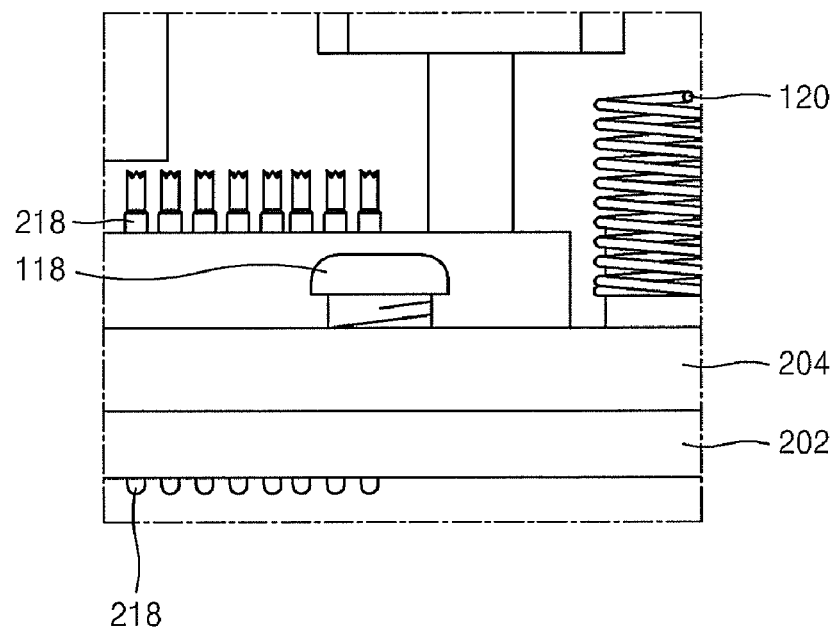
Figure 8:
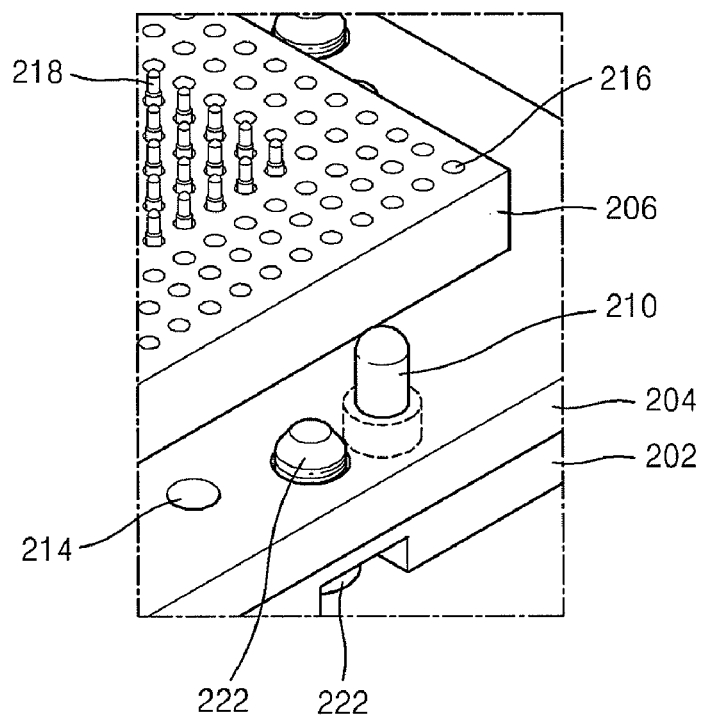

FIG. 7 schematically illustrates a state in which the pin plate assembly 200 is coupled to the housing frame 100. Referring to FIG. 7, the pin plate assembly 200 is directly coupled to the housing frame 100 without separating the lower pin plate 202 from the upper pin plate 204. FIG. 8 is a perspective view illustrating a coupling state of the guide pin 210 and the screw 222 of the pin plate assembly 200. Referring to FIG. 8, the screw 222 penetrates the lower pin plate 202 and the support plate 204, thereby coupling the lower pin plate 202 and the support plate 204. The guide pin 210 protrudes above the support plate 204. The guide pin 210 is inserted in the pin hole 114 of the housing frame 100 as described above.

FIGS. 9-12 are bottom plan views of a universal test socket illustrating a state in which the pin plate assembly 200 is coupled to the housing frame 100. In each of FIGS. 9-12, a circled portion located at the left side of the drawing illustrates a part of an external connection terminal array 502 including a plurality of external connection terminals 504, for example, a solder ball or a connection pad. The pitch of the external connection terminals 504 included in the external connection terminal array 502 is set to, for example, 0.5 mm. The pitch of the test pins 218 located at the pin array plate 216 is equally set to 0.5 mm.

FIGS. 9-12 illustrate that the positions of the test pins 218 arranged in the housing frame 100 are varied by rotating the pin plate assembly 200 when the pin plate assembly 200 is coupled to or inserted in the housing frame 100. Because the positions of the test pins 218 can be varied, the test pins 218 contact the external connection terminals 504 to perform a test even if the external connection terminal array 502 or the size of the semiconductor package changes.

Figure 9:
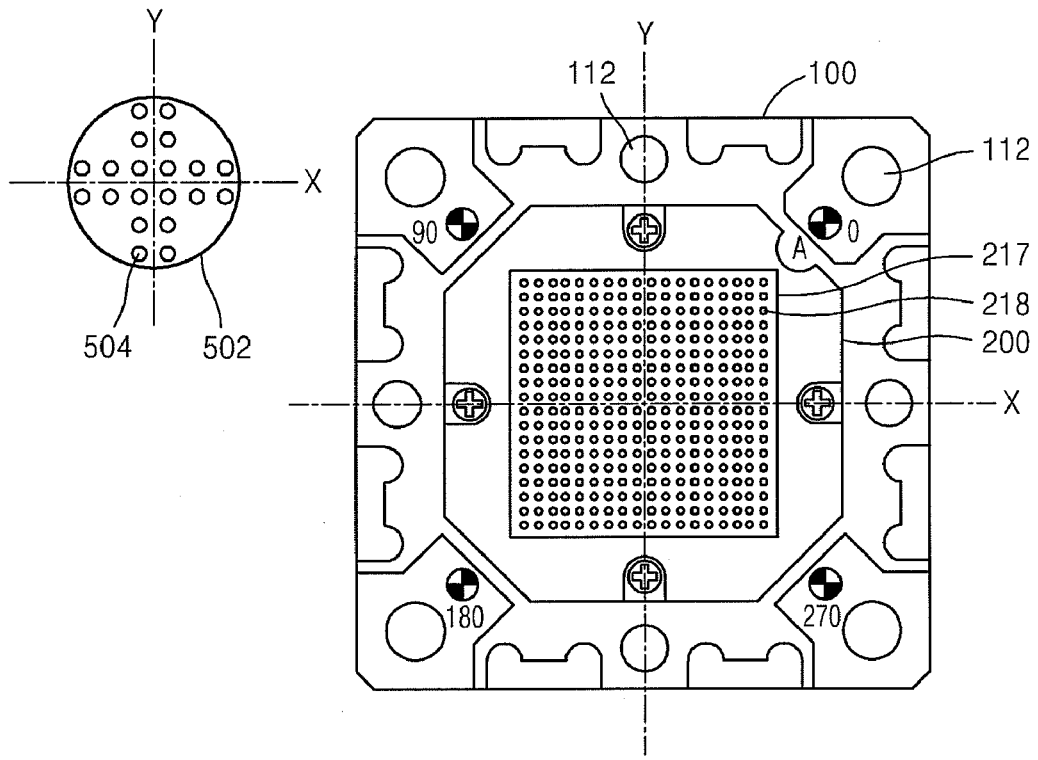
FIGS. 9-12 are bottom plan views of a universal test socket illustrating a pin plate assembly coupled to a housing frame.

In FIG. 9, an X axis and a Y axis passing through the center of the external connection terminal array 502 pass halfway between the external connection terminals 504. Another pair of X and Y axes at the right side of the drawing passing through the centers of the housing frame 100 and the pin plate assembly 200 pass halfway between the test pins 218. Thus, the configuration of the external connection terminals is the same as that of the test pins, and a test may be performed as the external connection terminals 504 contact the test pins 218 during the semiconductor package test. The case of FIG. 9 is referred to as group A and a letter A is marked on the rear surface of the housing frame 100 as an indication mark.

Figure 10:
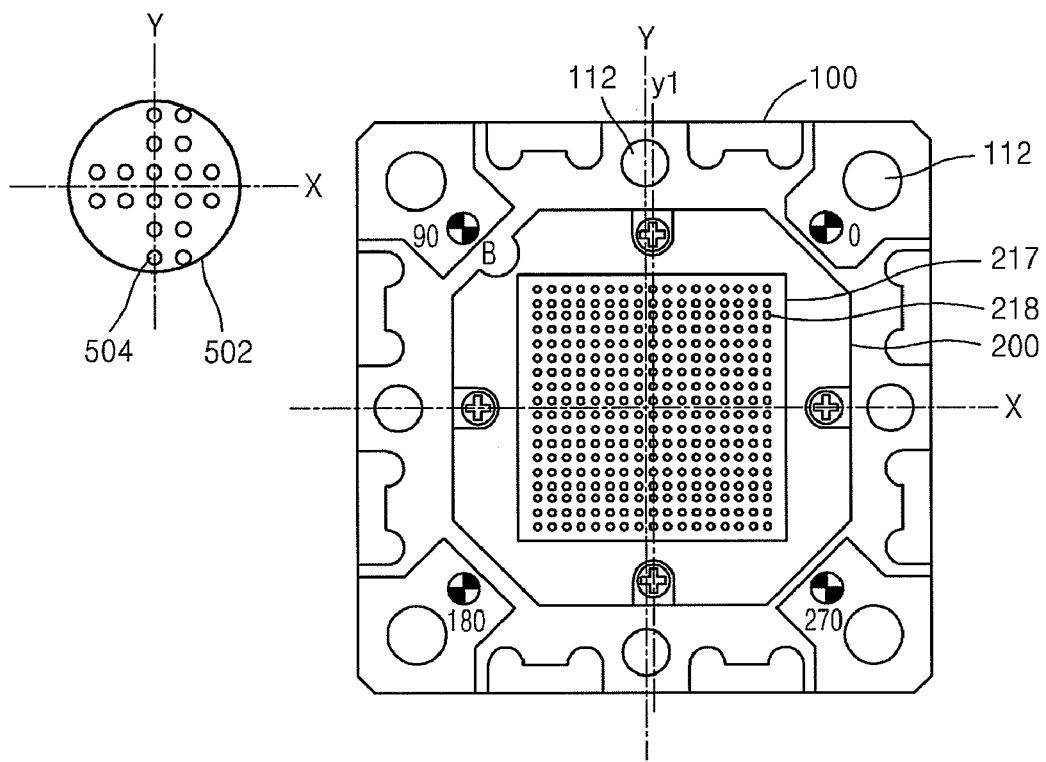

In FIG. 10, the X axis and the Y axis, both passing through the center of the external connection terminal array 502, respectively pass halfway between the external connection terminals 504 and pass through the centers of the external connection terminals 504. To compensate for this arrangement, the pin plate assembly 200 is coupled to the housing frame 100 by being rotated by 90° counterclockwise, compared to the case of FIG. 9. Then, compared to the case of FIG. 9, while the X axis passing through the centers of the housing frame 100 and the pin plate assembly 200 remains unchanged, a y1 axis passing through the center of the pin plate assembly 200 is moved 0.25 mm in the +X-axis direction from the Y axis of FIG. 9.

Thus, even when the arrangement of the external connection terminal array 502 is changed, the semiconductor package test may be performed as the test pins 218 contact the external connection terminals 504. The case of FIG. 10 is referred to as group B and a letter B is marked on the rear surface of the housing frame 100 as an indication mark.

Figure 11:
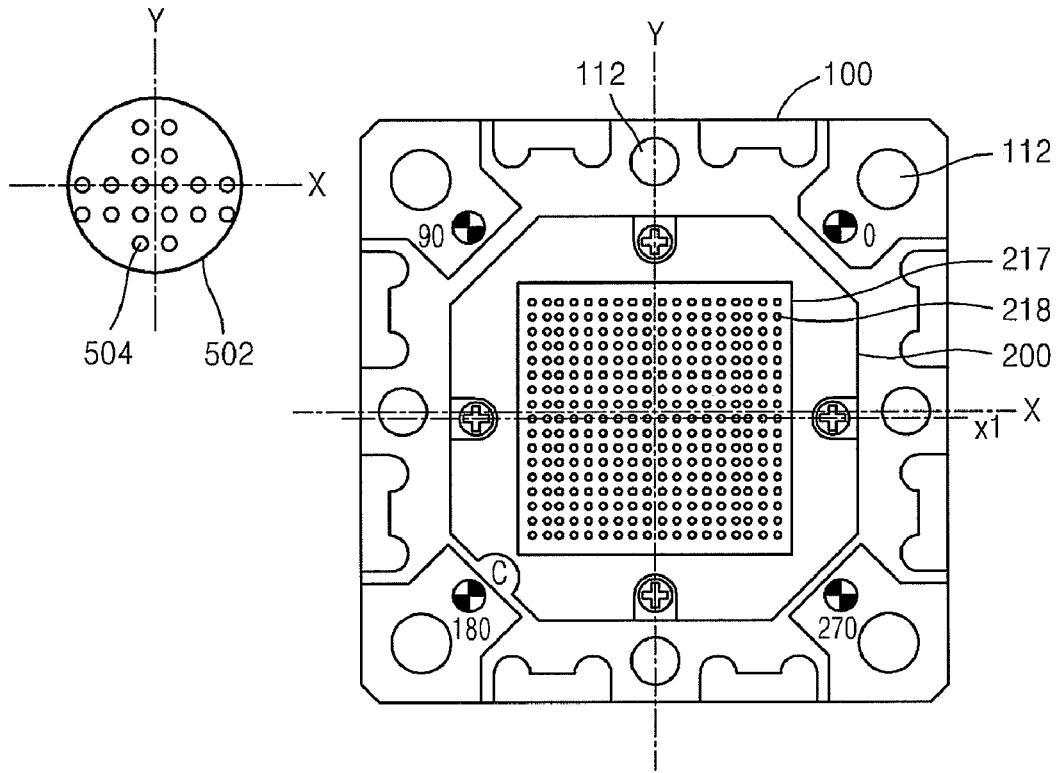

In FIG. 11, the X axis and the Y axis, both passing through the center of the external connection terminal array 502, respectively pass through the centers of the external connection terminals 504 and halfway between the external connection terminals 504. To compensate for this arrangement, the pin plate assembly 200 is coupled to the housing frame 100 by being rotated by 180° counterclockwise, compared to the case of FIG. 9. Then, compared to the case of FIG. 9, while the Y axis passing the centers of the housing frame 100 and the pin plate assembly 200 remains unchanged, an x1 axis passing the center of the pin plate assembly 200 is moved 0.25 mm in the −Y-axis direction from the X axis of FIG. 9.

Thus, even when the arrangement of the external connection terminal array 502 is changed, the semiconductor package test may be performed as the test pins 218 contact the external connection terminals 504. The case of FIG. 11 is referred to as group C and a letter C is marked on the rear surface of the housing frame 100 as an indication mark.

Figure 12:
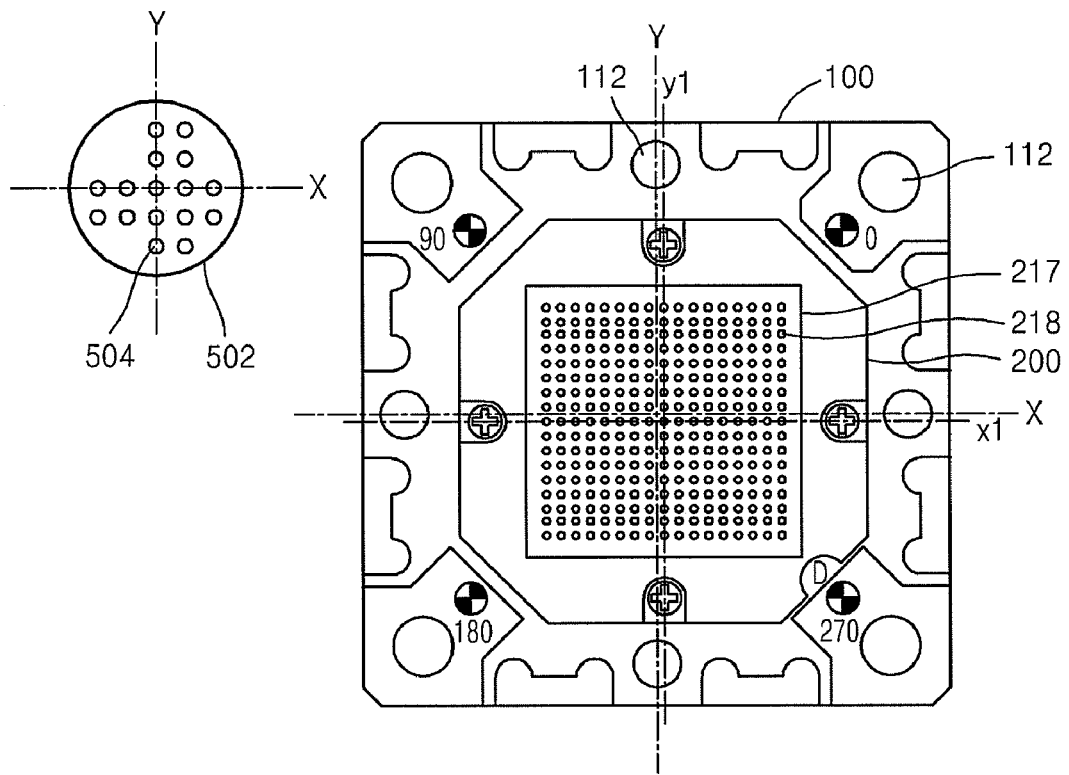

In FIG. 12, the X axis and the Y axis, both passing through the center of the external connection terminal array 502, pass through the centers of the external connection terminals 504. To compensate for this arrangement, the pin plate assembly 200 is coupled to the housing frame 100 by being rotated by 270° counterclockwise, compared to the case of FIG. 9. Then, compared to the case of FIG. 9, while the x1 and y1 axes, both passing through the center of the pin plate assembly 200, are moved 0.25 mm in the −Y and +X axes directions, respectively.

Thus, even when the arrangement of the external connection terminal array 502 is changed, the semiconductor package test may be performed as the test pins 218 contact the external connection terminals 504. The case of FIG. 12 is referred to as group D and a letter D is marked on the rear surface of the housing frame 100 as an indication mark.

Figure 13:
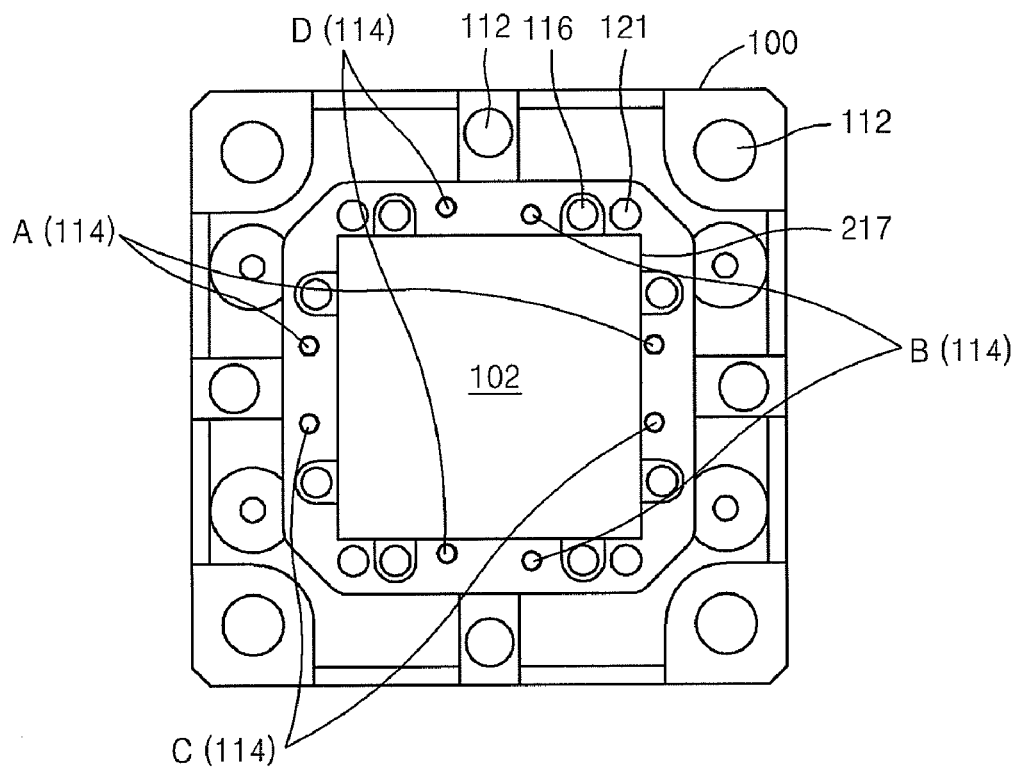
FIGS. 13 and 14 are plan views of a housing frame in which pin holes and screw holes are formed at various positions according to an exemplary embodiment of the present inventive concept.
Figure 14:
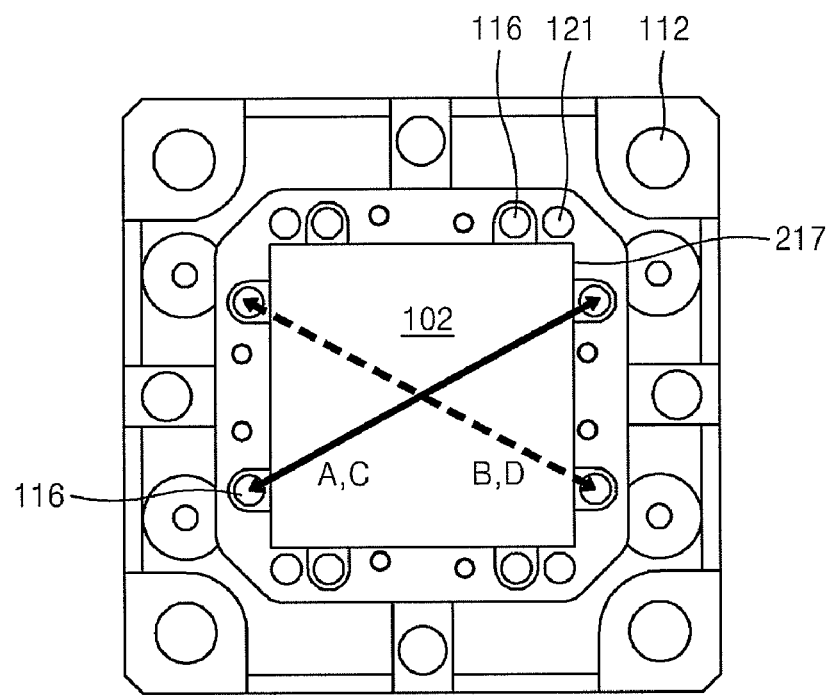

FIGS. 13 and 14 are plan views of the housing frame 100 in which the pin holes and the screw holes are formed at various positions according to an embodiment of the present inventive concept.

Referring to FIGS. 13 and 14, the pin holes 114 in which the guide pins 210 are inserted for each group are formed at different positions. With respect to the X axis and the Y axis passing through the center of the housing frame 100, the pin holes 114 of group A are located in the first and second quadrants to face each other with respect to the through window 102. The pin holes 114 of group B are located in the first and fourth quadrants to face each other with respect to the through window 102. The pin holes 114 of group C are located in the third and fourth quadrants to face each other with respect to the through window 102. The pin holes 114 of group D are located in the second and third quadrants to face each other with respect to the through window 102.

As illustrated in FIG. 14, the positions of the screw holes 116 located in the housing frame 100 according to the present exemplary embodiment and connected to the pin plate assembly 200 are different from each other depending on the group. While the groups A and C are positioned in the first and third quadrants as indicated by a solid arrow in FIG. 14, the groups B and D are positioned in the second and fourth quadrants as indicated by a dotted arrow in FIG. 14. In FIGS. 13 and 14, the spring 120 is inserted in a hole 121.

Figure 15:
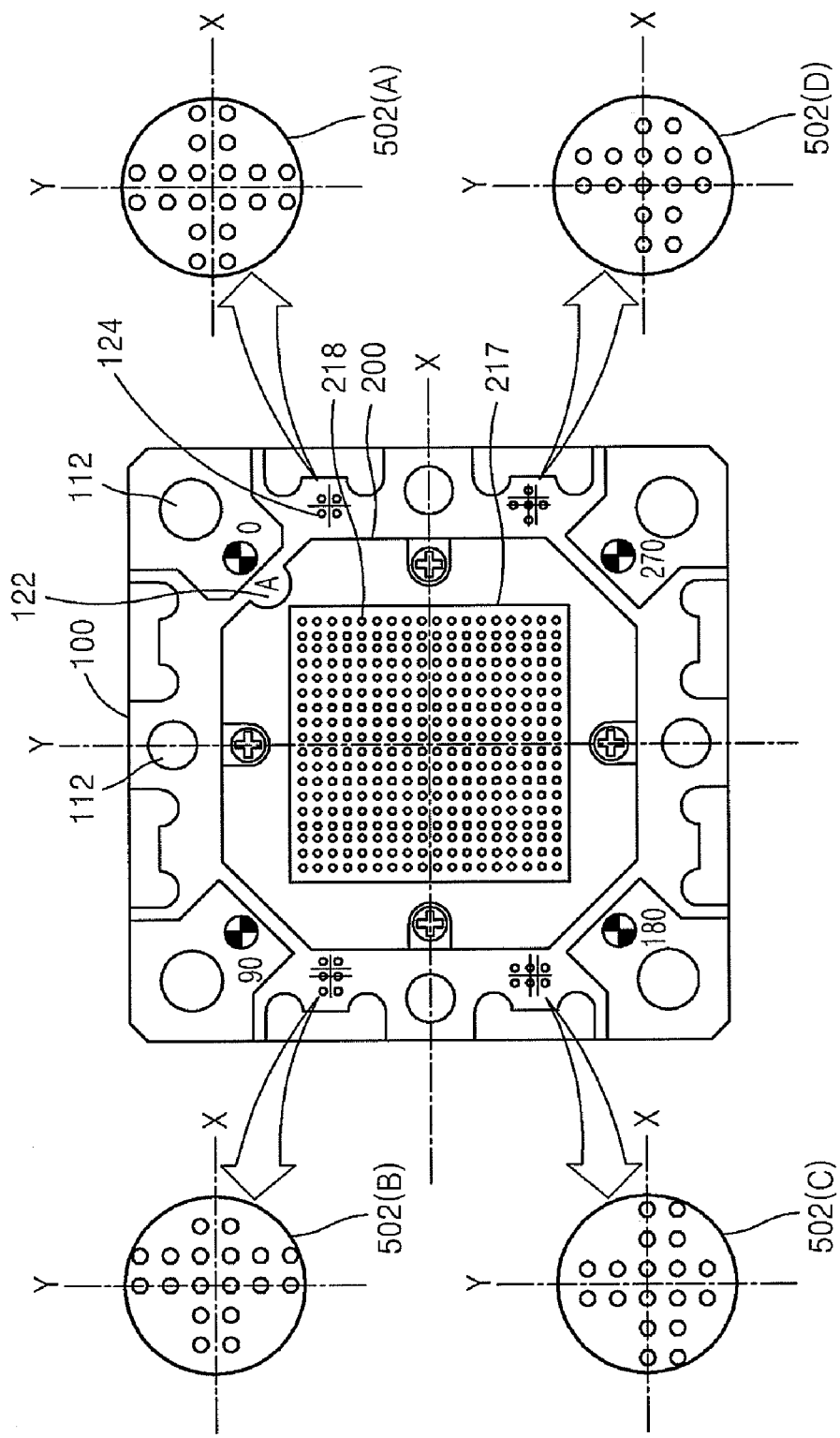
FIG. 15 is a bottom plan view of a universal test socket illustrating a pin plate assembly coupled to a housing frame.

FIG. 15 is a bottom plan view of a universal test socket illustrating a state in which the pin plate assembly 200 is coupled to the housing frame 100. FIG. 15 illustrates a state of the group A. Referring to FIG. 15, when the pin plate assembly 200 is coupled to the housing frame 100, a user may refer to indication portions 122 and 124 on the rear surface of the inner protruding portion 108 of the housing frame 100 to identify the insertion positions of the guide pins 210 of the pin plate assembly 200. The indication portion 122 indicates a group and the indication portion 124 indicates the external connection terminal array 502 of the semiconductor package.

Figure 16:
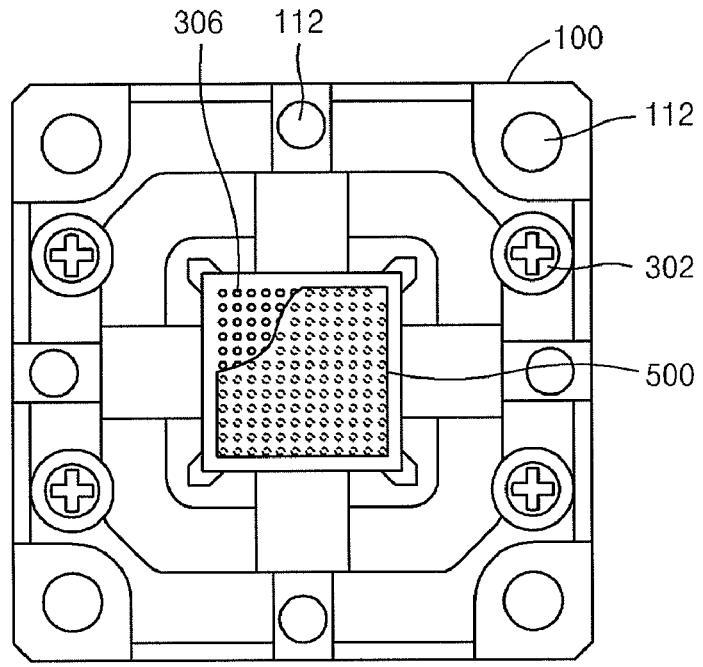
FIGS. 16 and 17 illustrate a semiconductor package testing apparatus having a universal test socket and a semiconductor package mounted on a test board.
Figure 17:
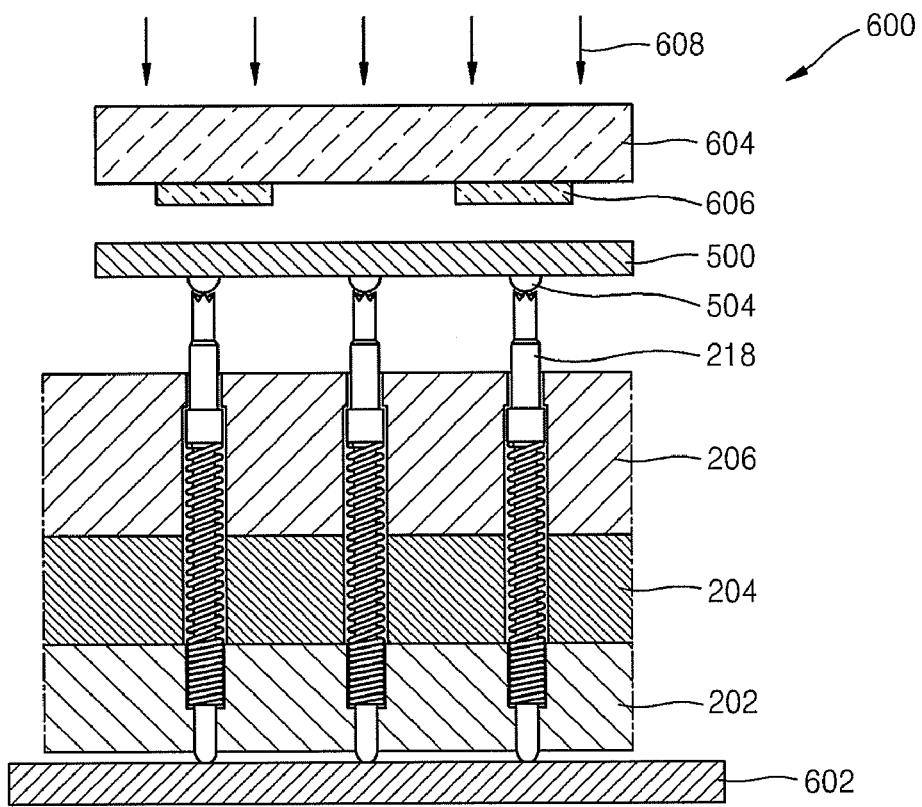

FIGS. 16 and 17 illustrate a semiconductor package testing apparatus having a universal test socket and a semiconductor package which are mounted on a test board. FIG. 16 is a plan view illustrating a state in which a semiconductor package 500 is mounted on the universal test socket 400. FIG. 17 is a cross-sectional view illustrating the universal test socket 400 and the semiconductor package 500 mounted on a test board 602. As illustrated in FIG. 16, the semiconductor package 500 is located on the package guide portion 300 of the universal test socket 400. The universal test socket 400 including the semiconductor package 500 thereon is located on the test board 602 forming a semiconductor package testing apparatus 600.

A cover 604 having a pusher 606 for pressing the semiconductor package 500 using a force as indicated by solid arrows 608 is installed on the package guide portion 300. The force 608 may be applied to the cover 604 by using, for example, automation equipment in the semiconductor package testing apparatus 600. The force 608 may be manually applied by coupling the cover 604 to the universal test socket 400.

Accordingly, the semiconductor package 500 placed on the package guide portion 300 of the universal test socket 400 is pressed by the pusher 606 so that the external connection terminals 504 and the upper portions of the test pins 218 are electrically connected to each other. Also, when the pusher 606 presses the semiconductor package 500, the test board 602 is electrically connected to the lower portions of the test pins 218. Thus, the external connection terminals 504 of the semiconductor package 500 are connected to the test board 602 and tested by the semiconductor package testing apparatus 600 to determine whether the semiconductor package 500 is defective or not.

The cover 604, capable of being manually operated to apply a force to the semiconductor package 500 by being coupled to the universal test socket 400 in the semiconductor package testing apparatus 600 is described below in further detail. Testing of a semiconductor package on a semiconductor test line may be facilitated by using the cover 604.

Figure 18:
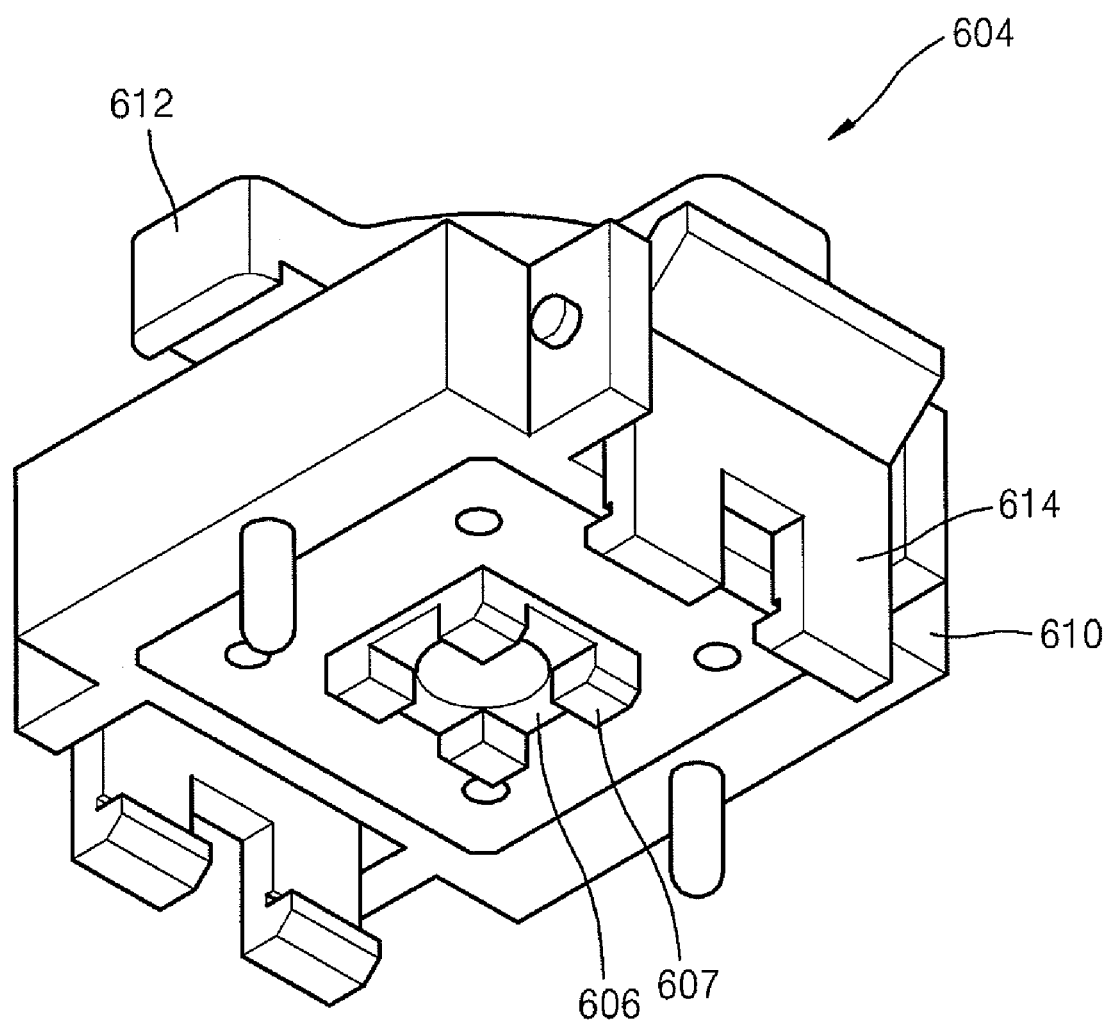
FIG. 18 is a perspective view illustrating a cover that may be coupled to the universal test socket in a semiconductor package testing apparatus according to an exemplary embodiment of the present inventive concept.
Figure 19:
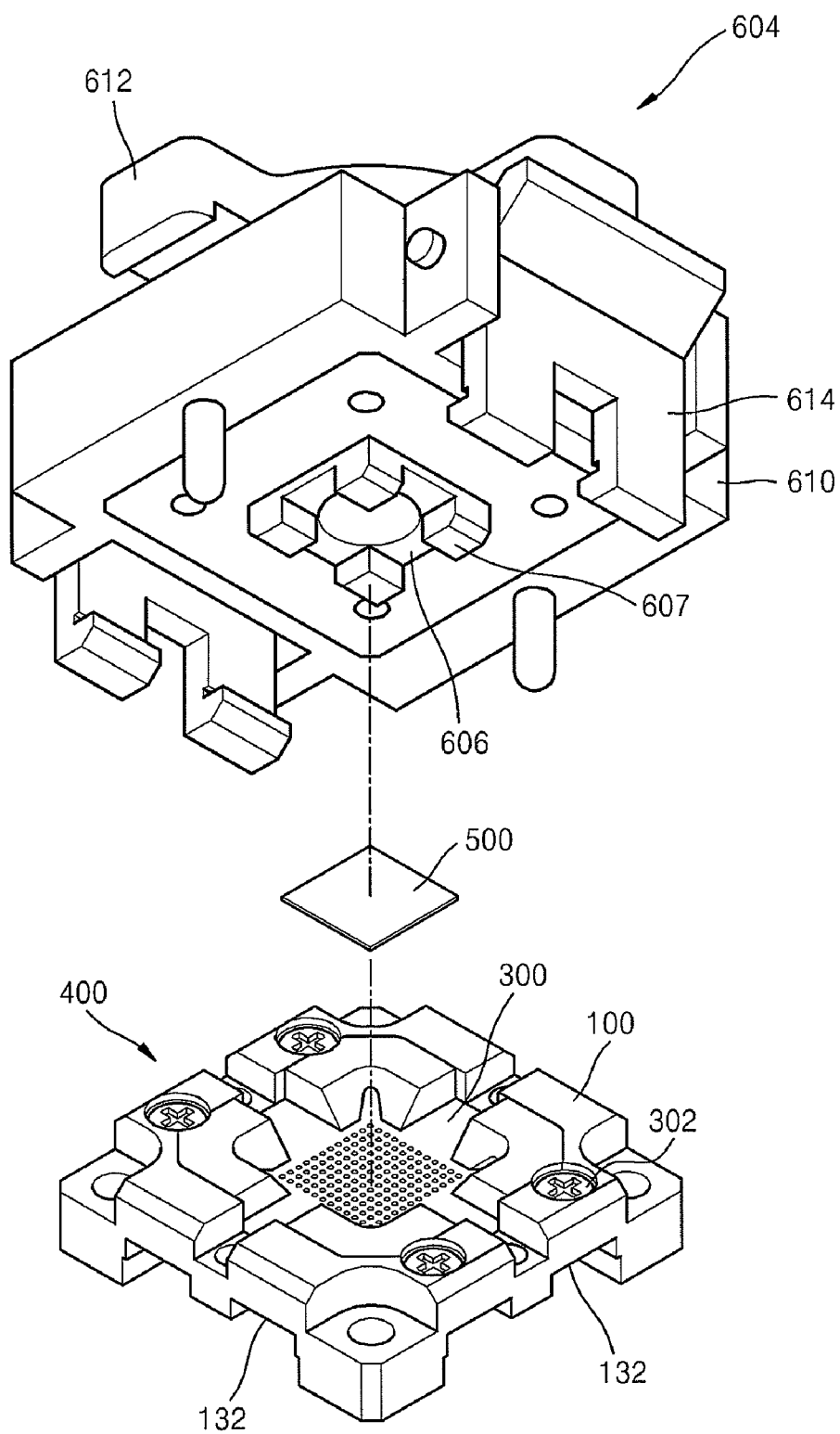
FIG. 19 illustrates a process in which the universal test socket and a cover are coupled to each other in a semiconductor package testing apparatus according to an exemplary embodiment of the present inventive concept.

FIG. 18 is a perspective view illustrating the cover 604 that may be coupled to the universal test socket 400 in a semiconductor package testing apparatus according to an exemplary embodiment of the present inventive concept. FIG. 19 illustrates a process in which the universal test socket 400 and the cover 604 are coupled to each other in a semiconductor package testing apparatus according to an exemplary embodiment of the present inventive concept.

Referring to FIGS. 18 and 19, the cover 604 according to the present exemplary embodiment includes a cover frame 610. A latch 614 is formed at both sides of the cover frame 610. The hook steps 132 are formed at the outer portion of the housing frame 100. The cover 604 and the housing frame 100 are coupled to each other by the hook steps 132 and the latches 614.

A handle 612, connected to the pusher 606 at the central portion of the cover frame 610, is installed at the cover 604 according to the present exemplary embodiment. The handle 612 penetrates the cover frame 610 and is connected to the pusher 606. The handle 612 may be moved up and down according to the rotation of the handle 612. The semiconductor package 500, placed on the package guide portion 300 of the universal test socket 400, is pressed downwardly by receiving a force generated by the pusher 606 when the handle 612 is rotated in a state in which the cover 604 and the universal test socket 400 are coupled to each other. The pusher 606 is connected to the lower surface of the cover frame 610 and includes four protrusions 607 for applying a force to the semiconductor package 500. The size of the pusher 606 including the protrusions 607 is set to correspond to the size of the semiconductor package 500.

Figure 20:
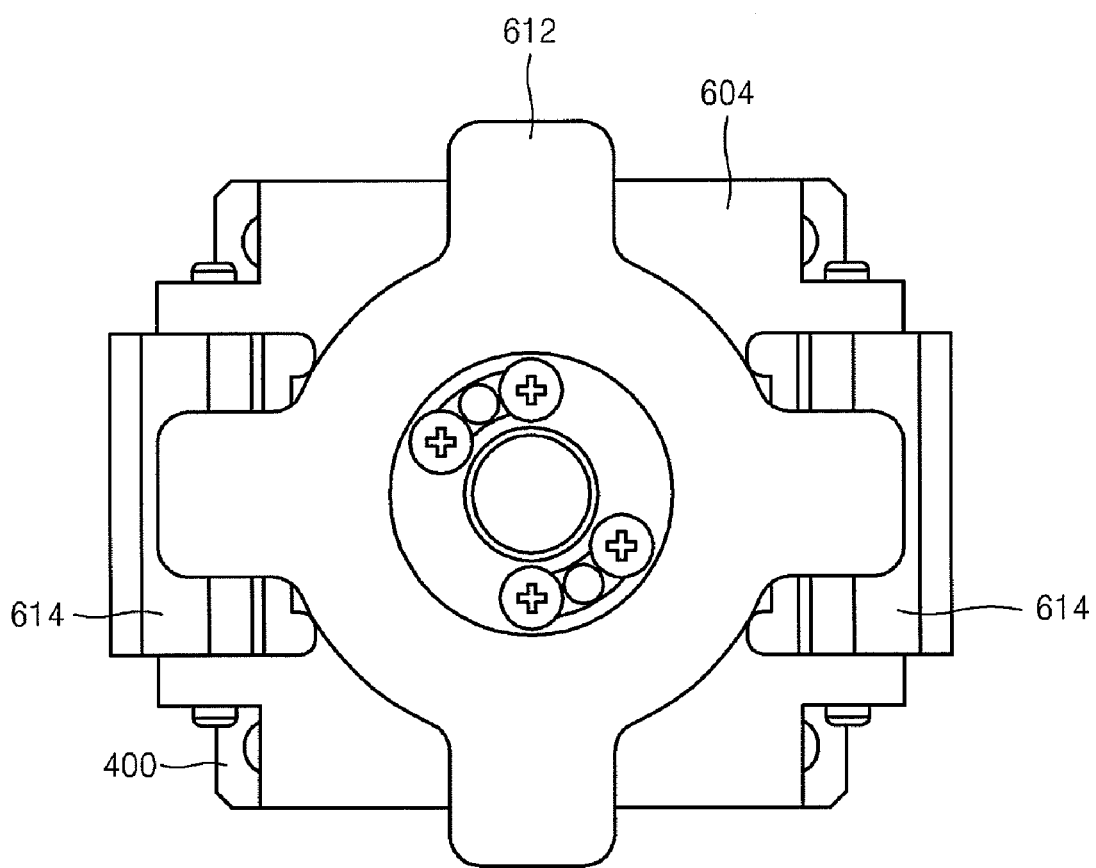
FIGS. 20 and 21 are plan views illustrating a state in which the universal test socket and a cover are coupled to each other in a semiconductor package testing apparatus according to an exemplary embodiment of the present inventive concept.
Figure 21:
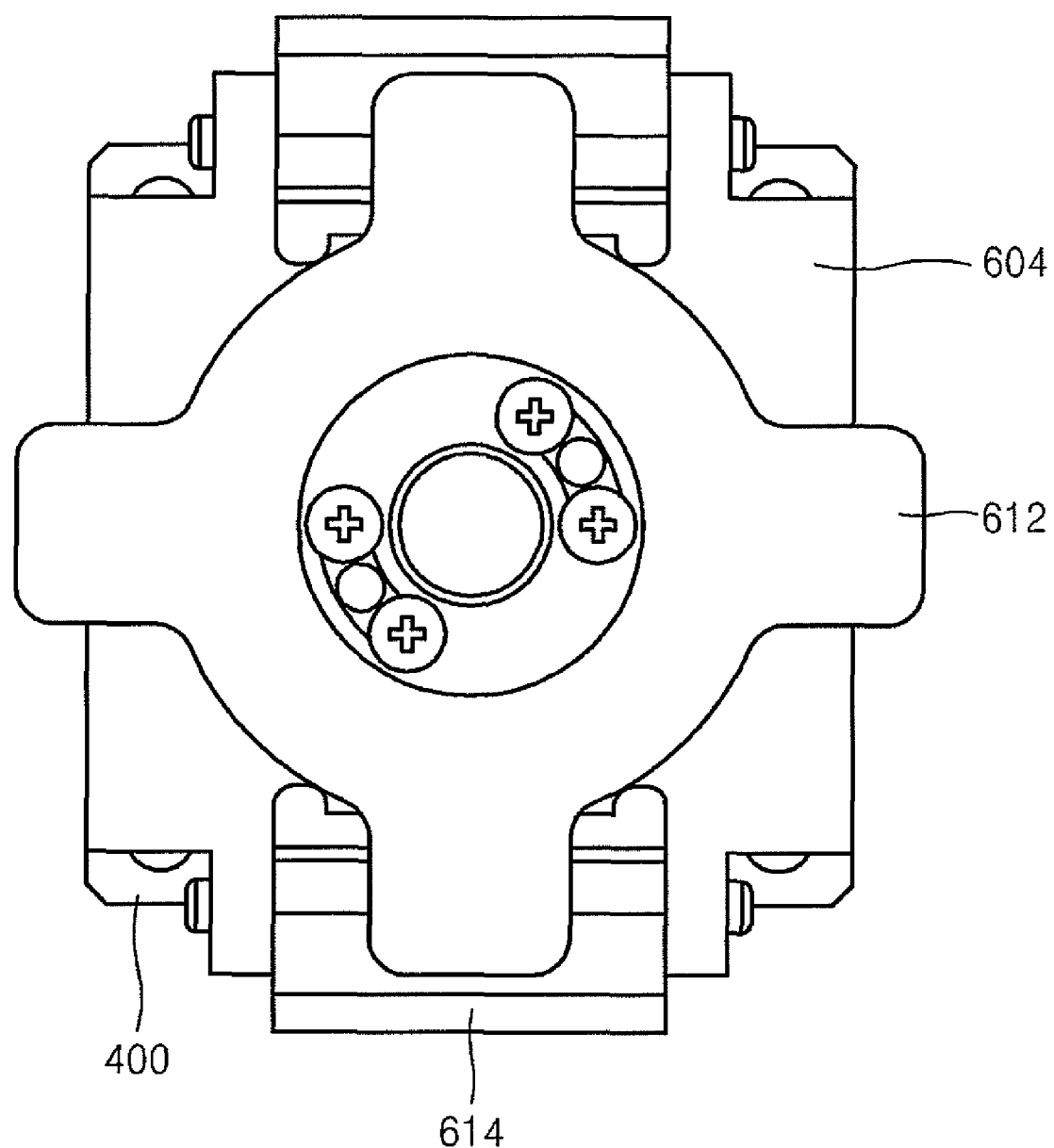

FIGS. 20 and 21 are plan views illustrating a state in which the universal test socket 400 and the cover 604 are coupled to each other in a semiconductor package testing apparatus according to an exemplary embodiment of the present inventive concept. FIG. 20 illustrates that the cover 604 is horizontally coupled to the universal test socket 400 by using the latch 614. FIG. 21 illustrates that the cover 604 is vertically coupled to the universal test socket 400 by using the latch 614. Referring to FIGS. 20 and 21, since the cover 604 of the present exemplary embodiment can be coupled to the universal test socket 400 in both horizontal and vertical directions, the operation of semiconductor package testing apparatus can be the same regardless of whether the shape of the semiconductor package 500 is square or rectangular.

While the inventive concept has been particularly shown and described with reference to exemplary embodiments thereof, it will be understood that various changes in form and details may be made therein without departing from the spirit and scope of the following claims.

What is claimed is:

1. A test socket comprising:
a housing frame including a side wall, a protruding portion protruding inwardly from the side wall, and a plurality of pin holes, and a through window formed at a center portion of the housing frame, wherein the through window is surrounded by the side wall, and wherein the protruding portion protrudes inwardly from a position on the side wall that is below a top edge of the side wall so that the protruding portion is recessed with respect to the top edge of the side wall;
a pin plate assembly coupled to the housing frame and including a pin plate in which a plurality of test pins are arranged and a plurality of guide pins formed on a periphery of the pin plate and inserted in the pin holes; and
a package guide portion coupled to the housing frame and located above the pin plate assembly,
wherein positions of the test pins arranged in the housing frame are varied according to a rotation angle of the pin plate assembly with respect to the housing frame,
wherein, when the rotation angle is one of 90°, 180° or 270°, the positions of the test pins arranged in the housing frame are moved in at least one of an X-axis or Y-axis direction with respect to the positions of the test pins when the rotation angle is 0°, and wherein the location of an intersection of x and y axes at a center of the plurality of test pins at 0° is shifted off the center in at least one of the X-axis or Y-axis direction when the rotation angle is one of 90°, 180° or 270°.

2. The test socket of claim 1, wherein a plurality of first screw holes are formed in a peripheral surface of the pin plate assembly, a plurality of second screw holes are formed in the protruding portion of the housing frame, and the pin plate assembly and the housing frame are coupled to each other by a plurality of screws inserted in the first and second screw holes.

3. The test socket of claim 1, wherein a spring is inserted in a hole in the protruding portion of the housing frame.

4. The universal test socket of claim 1, wherein the through window has a rectangular shape and the pin plate has an area larger than an area of the through window.

5. The test socket of claim 1, wherein the package guide portion is positioned on a top surface of the protruding portion.

6. A test socket comprising:
a housing frame including a base plate, a through window formed in a center portion of the base plate, a side wall formed along an edge of the base plate, and a protruding portion inwardly protruding from the side wall, wherein the protruding portion includes a plurality of pin holes formed therein, and wherein the protruding portion protrudes inwardly from a position on the side wall that is below a top edge of the side wall so that the protruding portion is recessed with respect to the top edge of the side wall;
a pin plate assembly including an upper pin plate positioned in the through window, the upper pin plate including a pin array plate including a plurality of test pins, a lower pin plate positioned below the upper pin plate, and a plurality of guide pins formed on a periphery of the upper and lower pin plates; and
a package guide portion located above the pin plate assembly and including a package mounting area on which a semiconductor package to be tested is mounted, wherein positions of the test pins arranged in the housing frame are varied according to a rotation angle of the pin plate assembly with respect to the housing frame.

7. The test socket of claim 6, wherein a hole array area is formed in the package mounting area, the hole array area including a plurality of holes.

8. The test socket of claim 7, wherein a pitch of the test pins is the same as a pitch of the holes formed in the hole array area and a pitch of connection terminals positioned on the semiconductor package to be tested.

9. The test socket of claim 6, wherein an indication portion is positioned on a rear surface of the protruding portion to indicate the positions of the test pins in connection with the rotation angle of the pin plate assembly when the pin plate assembly is coupled to the housing frame.

10. The test socket of claim 6, wherein the rotation angle is one of 0°, 90°, 180° or 270°.

11. The test socket of claim 10, wherein, when the rotation angle is one of 90°, 180° or 270°, the positions of the test pins arranged in the housing frame are moved in at least one of an X-axis or Y-axis direction with respect to the positions of the test pins when the rotation angle is 0°.

12. The test socket of claim 6, wherein the package guide portion is positioned on a top surface of the protruding portion.

13. An apparatus for testing a semiconductor package comprising:
a test socket including:
a housing frame including a side wall, a protruding portion protruding inwardly from the side wall and including a plurality of pin holes, a through window in a center portion of the housing frame and surrounded by the side wall, wherein the protruding portion protrudes inwardly from a position on the side wall that is below a top edge of the side wall so that the protruding portion is recessed with respect to the top edge of the side wall,
a pin plate assembly coupled to the housing frame and including a pin plate having a plurality of test pins are arranged therein, and a plurality of guide pins formed on a periphery of the pin plate, and
a package guide portion located above the pin plate assembly, on which a semiconductor package to be tested is mounted;
a cover including a pusher that electrically connects connection terminals of the semiconductor package with the test pins by applying pressure to the semiconductor package; and
a test board located under the pin plate assembly, wherein the test board is electrically connected to the test pins when the pusher applies the pressure to the semiconductor package,
wherein the pin plate assembly is coupled to the housing frame by inserting the guide pins in the pin holes, and the positions of the test pins arranged in the housing frame are varied according to a rotation angle of the pin plate assembly with respect to the housing frame,
wherein, when the rotation angle is one of 90°, 180° or 270°, the positions of the test pins arranged in the housing frame are moved in at least one of an X-axis or Y-axis direction with respect to the positions of the test pins when the rotation angle is 0°, and wherein the location of an intersection of x and y axes at a center of the plurality of test pins at 0° is shifted off the center in at least one of the X-axis or Y-axis direction when the rotation angle is one of 90°, 180° or 270°.

14. The apparatus of claim 13, wherein the housing frame includes a hook step formed at an outer portion of the housing frame, the cover includes a latch formed at an outer portion of the cover, and the latch engages the hook step to couple the cover and the housing frame to each other.

15. The apparatus of claim 14, wherein the cover is coupled to the housing frame in left and right and up and down directions with respect to the housing frame.

16. The apparatus of claim 13, wherein the cover includes a cover frame and a handle on the cover frame, wherein the pusher is moved up and down according to a rotation of the handle.

17. The apparatus of claim 16, wherein the pusher is located on a lower surface of the cover frame and includes a protruding portion applying the pressure to the semiconductor package.

18. The apparatus of claim 13, wherein a pitch of the test pins is the same as a pitch of the connection terminals.

19. The apparatus of claim 13, wherein the package guide portion includes a package mounting area on which the semiconductor package is mounted and a hole array area including a plurality of holes having a pitch same as the pitch of connection terminals.

20. The apparatus of claim 13, wherein the package guide portion is positioned on a top surface of the protruding portion.

* * * * *